(12) United States Patent
Knapp et al.

(10) Patent No.: US 12,525,946 B2
(45) Date of Patent: Jan. 13, 2026

(54) THIN-FILM SAW DEVICE UTILIZING RAYLEIGH MODE

(71) Applicant: RF360 SINGAPORE PTE. LTD., Republic Plaza (SG)

(72) Inventors: Matthias Knapp, Munich (DE); Ingo Bleyl, Munich (DE); Markus Hauser, Feldafing (DE)

(73) Assignee: RF360 Singapore Pte. Ltd., Singapore (SG)

( * ) Notice: Subject to any disclaimer, the term of this patent is extended or adjusted under 35 U.S.C. 154(b) by 868 days.

(21) Appl. No.: 17/775,250

(22) PCT Filed: Nov. 11, 2020

(86) PCT No.: PCT/EP2020/081790
§ 371 (c)(1),
(2) Date: May 6, 2022

(87) PCT Pub. No.: WO2021/094392
PCT Pub. Date: May 20, 2021

(65) Prior Publication Data
US 2022/0393660 A1 Dec. 8, 2022

(30) Foreign Application Priority Data
Nov. 14, 2019 (DE) ...................... 10 2019 130 779.1

(51) Int. Cl.
*H03H 9/02* (2006.01)
*H03H 9/145* (2006.01)

(52) U.S. Cl.
CPC .... *H03H 9/02574* (2013.01); *H03H 9/02551* (2013.01); *H03H 9/02834* (2013.01); *H03H 9/145* (2013.01)

(58) Field of Classification Search
CPC ........... H03H 9/02574; H03H 9/02551; H03H 9/02834; H03H 9/145; H03H 9/02559; H03H 9/02866
See application file for complete search history.

(56) References Cited

U.S. PATENT DOCUMENTS

| | | |
|---|---|---|
| 2003/0168930 A1 | 9/2003 | Kando et al. |
| 2008/0111450 A1 | 5/2008 | Kando |
| 2017/0033764 A1 | 2/2017 | Inoue et al. |
| 2018/0034439 A1 | 2/2018 | Ruby et al. |
| 2019/0123709 A1 | 4/2019 | Inoue et al. |

(Continued)

FOREIGN PATENT DOCUMENTS

| | | |
|---|---|---|
| WO | 2018215152 | 11/2018 |
| WO | WO-2019082901 A1 | 5/2019 |

OTHER PUBLICATIONS

International Search Report and Written Opinion—PCT/EP2020/081790—ISA/EPO—Feb. 16, 2021.

*Primary Examiner* — Emily P Pham
(74) *Attorney, Agent, or Firm* — Polsinelli

(57) ABSTRACT

A surface acoustic wave device (5) is provided using a layered substrate system with a special material and a special cut of a piezoelectric thin film (4) selected for utilizing Rayleigh mode. The proper choice of the material and the cut of the piezoelectric thin film leads to a low velocity of the excited wave mode, which allows the usage of smaller devices without deteriorating other performance parameters according to specifications.

13 Claims, 2 Drawing Sheets

(56) References Cited

U.S. PATENT DOCUMENTS

| | | |
|---|---|---|
| 2019/0165764 A1 | 5/2019 | Taniguchi |
| 2019/0253035 A1 | 8/2019 | Yamanouchi |
| 2019/0312564 A1 | 10/2019 | Kimura |
| 2019/0319603 A1 | 10/2019 | Kadota et al. |
| 2020/0144981 A1* | 5/2020 | Knapp ............... H03H 9/02834 |

* cited by examiner

THIN-FILM SAW DEVICE UTILIZING RAYLEIGH MODE

The evolution of next-generation mobile communication systems require filter devices with outstanding performance and properties like high electromechanical coupling factor $k^2$ and low temperature coefficient of frequency TCF.

SAW filter devices embodied on a sandwich substrate system or layer stack provide high coupling coefficients due to a sagittal wave guiding effect. One of the layers of a common multilayer substrate system is a $SiO_2$ layer providing a reduction of the TCF. Such a $SiO_2$ layer is used as a TCF compensating layer and the thickness thereof can be adjusted to achieve a desired TCF reduction. However, due to different impedances of the layer in sandwich systems, spurious modes e.g. bulk acoustic modes appear which are undesirable as they produce disturbing resonances in neighbored frequency bands at higher frequencies.

One layer stack includes a carrier substrate such as silicon (Si) or sapphire ($Al_2O_3$), dielectric functional layers such as AlN and $SiO_2$ and a piezoelectric material such as lithium tantalate (LiTaO3) on which electrodes are applied, for example.

Surface acoustic wave filters (SAW filter) in sandwich substrate systems exhibit inherently high electromechanical coupling as they generate a sagittal waveguide due to their suitably selected layer sequence. Further, functional layers are applied to the electrodes or under the piezo material in order to specifically improve the properties of the component, such as its temperature coefficient of frequency (TCF).

Some sandwich systems use a piezoelectric thin film of Lithium tantalate LT. A cut angle is chosen that mainly excites and propagates a leaky surface wave. This wave has a relative high acoustic velocity and hence requires an IDT (interdigital transducer) having electrode fingers with a relative high pitch for exciting a wave of a desired frequency when compared to a wave having a lower acoustic velocity.

As a consequence of this limiting feature the size of respective SAW devices requires a minimum size to arrange IDT with the relative high pitch. However due to the ongoing demand for smaller devices a possibility is required to further reduce the device size without reducing the performance thereof.

A further disadvantage of the currently used layered substrate systems results from the stacking of layers with different impedances. As a result, higher modes and volume modes can propagate that are disadvantageous in carrier aggregation applications.

In addition, devices with the currently used layered substrate systems exhibit a significant difference between the TCF of the left and right band edge that is typically greater than 20 ppm/K. This is disadvantageous, since the bandwidth of the component changes significantly as a result of rising temperature, and the matching of the component to temperature differences is no longer optimal.

It is hence an object to provide a surface acoustic wave device which avoids at least one of the above mentioned disadvantages.

A surface acoustic wave device is provided using a layered substrate system with a special material and a special cut of a piezoelectric thin film. The proper choice of the material and the cut of the piezoelectric thin film leads to a low velocity of the excited wave mode, which allows the usage of smaller devices without deteriorating other performance parameters according to specifications.

The SAW device is realized by a layer stack comprising a sequence from the bottom to the top of
- a substrate
- a TCF compensating layer
- a piezoelectric thin film and
- an electrode structure wherein the piezoelectric thin film has a thickness and a cut-angle that favors excitement and propagation of a Rayleigh wave as a main mode.

In in accordance with an embodiment, the Rayleigh wave is used as a main mode. In systems using leaky surface waves (LSAW), the Rayleigh wave is featured as a spurious mode that appears below the leaky surface wave. By this new approach the spurious mode below the main mode has completely vanished because when using the Rayleigh mode as the main mode, no further mode can propagate below the resonant frequency, as this has the slowest velocity of the system. Other spurious modes like higher modes and bulk modes are shifted to higher frequencies up to a distance above the main mode where they do not disturb anymore.

A further advantage results from the lower acoustic velocity that is reduced by about 20% when compared with that of the leaky surface wave. This enables forming IDTs and other electrode structures with a smaller pitch at the same frequency as the former LSAW device. This allows a reduction of the device area.

In addition to reducing the propagation velocity of the wave, the material and the cut of the piezoelectric layer are selected so that the other performance parameters of the SAW device such as electromechanical coupling (k2) quality and TCF of the main mode are not significantly degraded.

A surprising effect can be regarded namely that the difference in TCF between left and right band edge has substantially reduced down to about 5 ppm/K. By this the bandwidth remains more constant and the temperature shift of the whole pass band may be substantially reduced A layer stack that favors the Rayleigh mode as the main mode can be achieved by a piezoelectric thin film composed of lithium niobate having a crystal cut with Euler angles of (0°/125°+−1570°). With this cut angle, a high coupling factor $k^2$ can be achieved and hence a sufficient broad band width of the SAW device. The leaky surface wave is not exited anymore (or excited of a negligible amount) or cannot be found in the transfer curve.

The piezoelectric thin film may have a thickness x with $0.1\lambda < x < 0.6\lambda$ where $\lambda$ is the wavelength of the acoustic main mode within the piezoelectric layer of a respective layer stack.

A corresponding TCF compensating layer may be a $SiO_2$ layer having a thickness y of $0.05\lambda < y < 0.5\lambda$. Alternatively, the TCF compensating layer comprises doped SiO2, GeO2.

In such a stack the substrate comprises a high resistive crystalline material. A high resistivity is a resistivity of at least 1000 Ωcm.

According to an embodiment this substrate material is a high resistive silicon with Euler angles of (−45°±10°, −54°±10°, 60°±20°) or (0°±10°, 0°±10°, 45°±20°). Alternatively the substrate comprises one of Quartz, Sapphire, Glass, Spinel and SiC.

Between the substrate and the TCF compensating layer a polycrystalline silicon may be arranged having a thickness z, wherein $0.05\lambda < z < 1.0\lambda$. This layer is a layer with a relative high acoustic velocity and improves the waveguiding of the SAW and reduces electric losses as well by localizing charge carriers therein. Alternatively, the high acoustic velocity layer comprises AlN, Si3N4, diamond, SiC.

Due to the good wave guidance of the layered system, leakage wave losses of the main mode can be prevented. This leaky wave is a shear wave with a relatively high propagation velocity.

In an alternative embodiment there is no additional layer between substrate and TCF compensating layer. Instead, the silicon substrate has an ion implant in a top surface region or is an amorphous layer or a dielectric layer.

The electrode structure may have a layered structure with Al as a main component of the layered electrode structure. In this embodiment the electrode structure has a preferred thickness z with $0.05\lambda < z < 0.25\lambda$.

In alternative embodiments the electrode structure may be a "Heavy electrode" to further reduce the velocity of the SAW. Useful examples are tungsten, molybdenum, copper-based electrode system, titanium and platinum.

The SAW device can be further completed by applying one or more dielectric passivation layers on top of the electrode structure. The passivation layer can have a thickness w with $0.0025\lambda < w < 0.2\lambda$. The dielectric may be chosen from $Si_3N_4$, $SiO_2$, SiON and $Al_2O_3$.

The following explains in more detail with reference to specific embodiments and the accompanied figures. The figures are schematic only and may not show all elements as far as these omitted elements are known in the art can easily be complemented by a skilled worker. Moreover the figures are not drawn to scale and some details may be depicted enlarged for better understanding.

Figure 1:
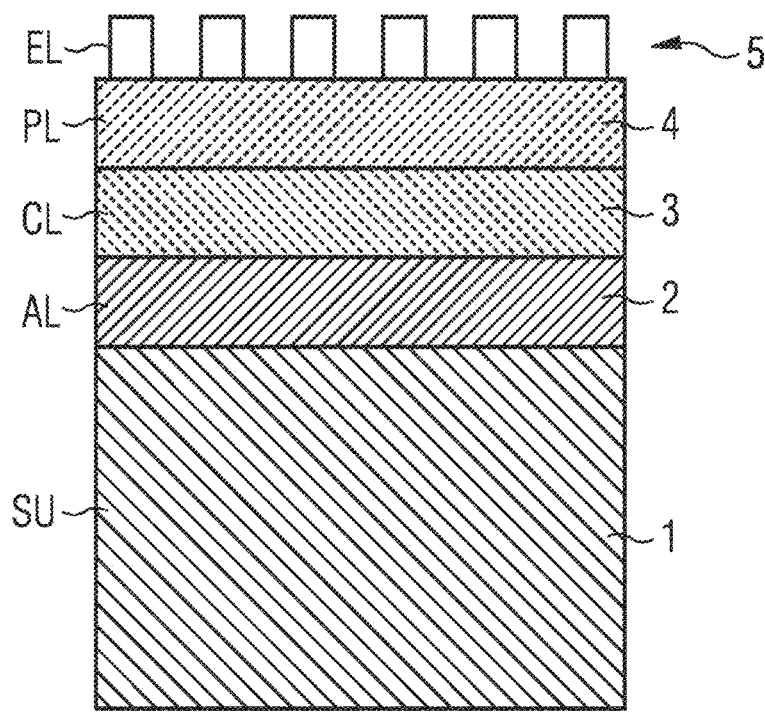
FIG. 1 shows a layer stack according to an embodiment

FIG. 1 shows a layer stack according to an embodiment realizing a SAW device. The stack comprises a substrate SU, a TCF compensating layer CL, a piezoelectric thin film PL and on top an electrode structure EL. An optional additional layer AL may arranged between substrate and TCF compensating layer. The electrode structure may realize a filter circuit, e.g. a ladder-type arrangement of resonators forming a band pass or a band stop filter (notch filter).

Figure 2:
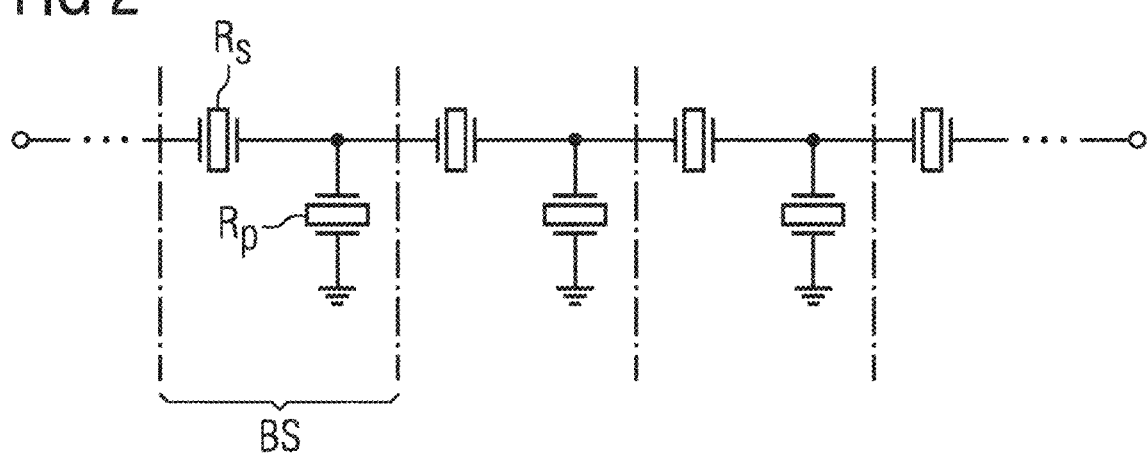
FIG. 2 shows a ladder type structure of SAW resonators as an example of a filter circuit realized by the electrode structure.

FIG. 2 is a schematic block diagram of a ladder-type arrangement of resonators as an embodiment of the SAW device. The acoustic SAW resonators are usually one-port resonators.

The ladder-type structure comprises a number of basic sections BS. Each basic section comprises at least a series resonator $R_S$ and a parallel resonator $R_P$ as well. Such basic sections BS may be connected in series in a number that is necessary to achieve a desired selectivity. Series resonators $R_S$ that belong to neighbored basic sections, may be combined to a common series resonator $R_S$ as well as parallel resonators $R_P$ may also be combined if they are directly neighbored and belonging to different basic sections BS.

Besides the depicted example only one basic section BS already forms a basic filter. Two, three or more basic sections may provide sufficient selectivity.

For use with special frequency bands, the frequency must be adjusted via the pitch of the electrode structure according to the formula $f=v/\Lambda$ where f represents the desired frequency of the final SAW device, v the propagation velocity of the acoustic wave and $\Lambda$ is 2 times the pitch giving the wavelength $\lambda$ adjustable via the pitch of the IDT that is formed from the electrode structure.

By the use of the Rayleigh mode as main mode of wave propagation the velocity of the acoustic wave can be reduced by about 20% from 3800 m/s (LSAW) to 3100 m/s (Rayleigh wave in a stack according to the embodiments described herein).

Rayleigh mode can set to be the dominant wave mode by properly selecting the piezoelectric layer in terms of material, thickness and crystal cut. Moreover, also thickness and material of other layers of the whole layer stack can be properly selected to support the desired wave mode.

As a result of using a Rayleigh wave, the pitch of the electrode structure of the SAW device could also be reduced by 20% in order to achieve the same frequency position of the single-port resonator. Accordingly, a final SAW device, which is formed by interconnecting several single-port resonators, can be significantly reduced in space requirements.

Figure 3:
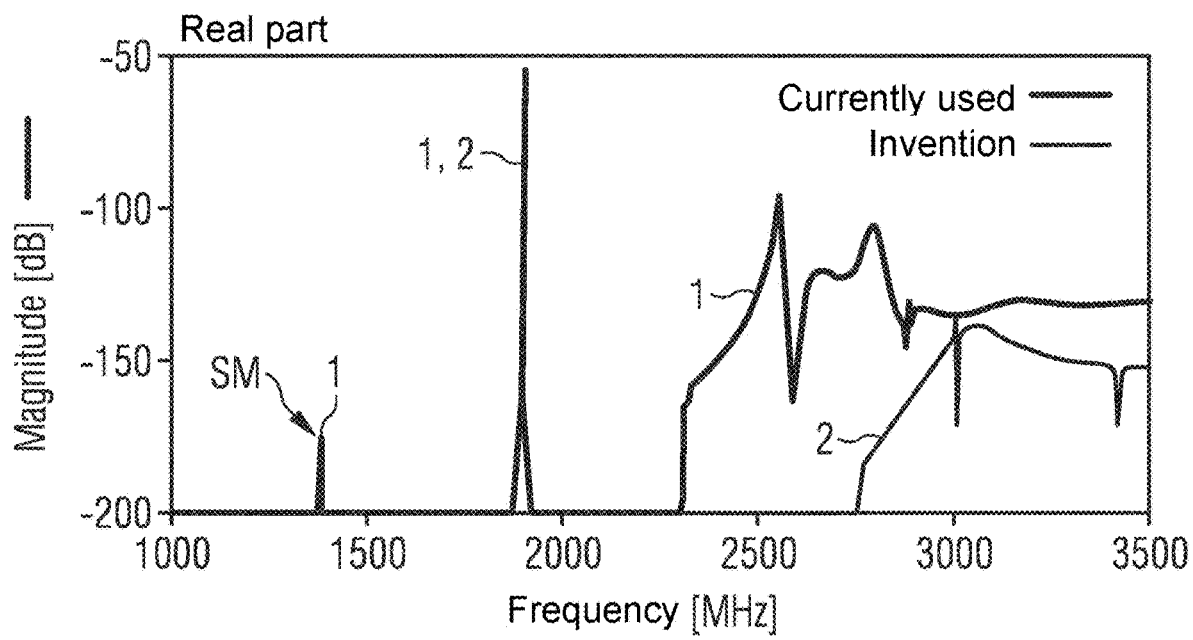
FIG. 3 shows admittance of a one-tor resonator of a currently typically used layer system compared with the admittance of a one-tor resonator according to embodiments of the disclosure.
Figure 3:
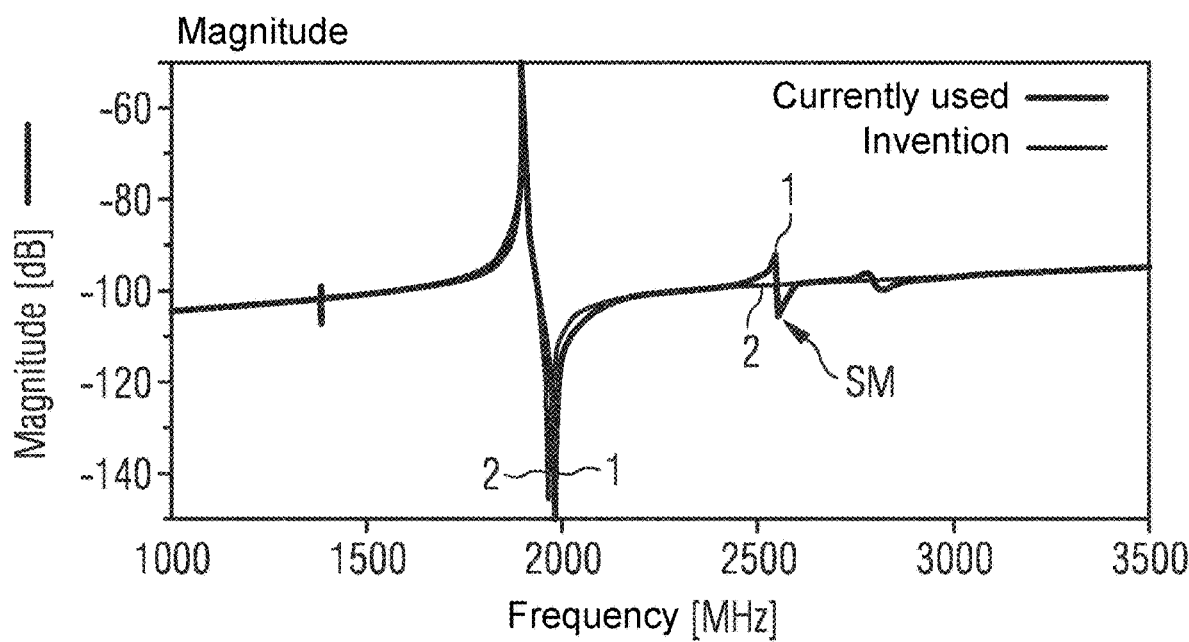

FIG. 3 shows the real part (upper diagram) and the absolute value (lower diagram) of the admittance of a single one-port resonator realized on a LSAW layer stack (curve 1/black line) compared with that of a one-port resonator according to an embodiment (curve 2, red line). Both resonators are designed to have the main mode at the same frequency.

The admittance curve 1 according to the stack using LSAW shows on both sides of the main mode disturbing resonances of spurious modes. Below the main resonance at 1800 MHz a small peak at about 1400 MHz results from a spurious Rayleigh wave mode (see arrow SM in the upper diagram). Above the resonant frequency, higher modes and bulk modes start occurring at a frequency of about 2300 MHz.

Contrary to that curve 2 which is assigned to a SAW resonator formed on a layer stack of various embodiments, does not show the disturbing modes anymore. By using the Rayleigh mode as the main mode, no further mode can propagate below the resonant frequency, as this mode (Rayleigh wave) has the slowest velocity of the system. Hence peak SM of curve 1 (see upper diagram) has vanished. The frequency of higher modes and bulk modes (compare peak SM of curve 1 in the lower diagram) are vanished too.

Disturbing modes do not occur below 2800 MHz that is substantially more distant from the main resonance as that of the resonator made from the known layer stack. Hence, the new SAW device is useful for forming filter devices for carrier aggregation.

Another advantage of the proposed layer stack is the difference in TCF between the left and right band edge of a SAW filter device produced from this new stack. This difference is typically greater than 20 ppm/K in currently used systems and has a negative effect on the device's bandwidth and matching, as the band edges change greatly with temperature. This effect results in a bandwidth of a respective SAW device that is decreasing with increasing temperature.

The proposed system reduces the difference in TCF to a value smaller than 5 ppm/K. Moreover, the bandwidth remains now much more constantly than that of a SAW device of a currently used stack.

Referring to the schematic layer sequence of FIG. 1 the single layers may be selected according to the following choice.

Substrate SU:
Possible materials may be chosen from
highly resistive Si with Euler angles (−45°±10°, −54°±10°, 60°±20°)
highly resistive Si with Euler angles (0°±10°, 0°±10°, 45°±20°)

One of quartz, glass, spinel and SiC

Additional Layer AL (Optional)

Possible materials may be chosen from:

Polycrystalline Si having a layer thickness x with $0.05\lambda < x < 1\lambda$

AlN, Si3N4, diamond, SiC having a layer thickness x with $0 < x < 1\lambda$ no layer but a substrate that has an ion implanted surface layer, an amorphous layer or a dielectric layer on top TCF compensating layer CL:

Possible Material $SiO_2$ having a layer thickness $0.05\lambda < y < 0.5\lambda$ $0.5\lambda$ of doped SiO2, GeO2

Piezoelectric thin film PL:

Possible material

LiNbo3 having a layer thickness x with $0.1\lambda < x < 0.6\lambda$ and Euler angles (0°/125°+−15°/0°)

Electrode Structure

Possible materials may be chosen from a layer sequence comprising Al as a main component having a layer thickness x with $0.05\lambda < z < 0.25\lambda$ a copper-based electrode system of one or more layers a single "heavy layer" chosen from W, Mo, Ti, Ag, Au, Ta and Pt Passivation Layer (Optional)

One or more layers having a thickness w with $0.0025\lambda < w < 0.2\lambda$

Possible materials may be chosen from: $Si_3N_4$, $SiO_2$, SiON and $Al_2O_3$

In the following embodiment the layers of a layer stack are specified in more detail. On this layer stack a one-port resonator realized. Based on the structure of this resonator the admittance curve 2 of FIG. 3 has been simulated. The device is designed for a resonance frequency of 1800 MHz.

Substrate SU: highly resistive Si with Euler angles (−45°±10°, −54°±10°, 60°±20°) or (0°±10°, 0°±10°, 45°±20°)

Additional layer AL: Polycrystalline Si having a layer thickness x=500 nm $SiO_2$ having a thickness y=550 nm Piezoelectric thin film PL: LiNbo3 having a layer thickness x=550 nm and Euler angles (0°/125°+−15°/0°)

Electrode structure EL: A layer sequence comprising Al as a main component having a layer thickness x=150 nm Passivation layer PL: Si3N4 having a thickness w=10 nm.

LIST OF USED TERMS AND REFERENCE SYMBOLS

|  | dielectric passivation layer |
|  | layer stack |
|  | passivation layer |
|  | SAW device |
| AL | additional layer |
| CL | TCF compensating layer |
| CL | TCF compensating layer |
| ES | electrode structure |
| PL | piezoelectric thin film |
| SU | substrate |
| w | thickness of passivation layer |
| x | thickness of the piezoelectric thin film |
| y | thickness of the TCF compensating layer |
| z | thickness of the electrode structure |

The invention claimed is:

1. A SAW device realized on a layer stack comprising:
a substrate;
a TCF compensating layer;
a piezoelectric thin film; and
an electrode structure,
wherein the piezoelectric thin film has a thickness and a cut-angle that favors excitement and propagation of a Rayleigh wave as a main mode, wherein the piezoelectric thin film is a lithium niobate film having a crystal cut with Euler angles of (0°/125°±15°/0°).

2. The SAW device of claim 1, wherein λ is a wavelength of the main mode and wherein the piezoelectric thin film has a thickness x with $0.1\lambda < x < 0.6\lambda$.

3. The SAW device of claim 1, wherein λ is a wavelength of the main mode and wherein:
the TCF compensating layer is a $SiO_2$ layer having a thickness y of $0.05\lambda < y < 0.5\lambda$.

4. The SAW device of claim 1, wherein the substrate comprises a high resistive crystalline material.

5. The SAW device of claim 1, wherein:
the substrate comprises silicon with Euler angles of (−45°±10°, −54°±10°, 60°±20°) or (0°±10°, 0°±10°, 45°±20°).

6. The SAW device of claim 1, wherein λ is a wavelength of the main mode and wherein the device further comprises an additional layer disposed
between the substrate and the TCF compensating layer that comprises a polycrystalline silicon having a thickness z, wherein $0.05\lambda < z < 1.0\lambda$.

7. The SAW device of claim 1, wherein λ is a wavelength of the main mode and wherein:
the electrode structure has a layered structures;
Al is a main component of the layered electrode structure; and
the electrode structure has a thickness z with $0.05\lambda < z < 0.25\lambda$.

8. The SAW device of claim 1, wherein λ is a wavelength of the main mode and wherein:
a dielectric passivation layer is arranged on the electrode structure, the passivation layer having a thickness w with $0.0025\lambda < w < 0.2\lambda$; and
a material of the dielectric passivation layer is chosen from $Si_3N_4$, $SiO_2$, SiON and $Al_2O_3$.

9. The SAW device of claim 1, wherein the TCF compensating layer comprises one of doped $SiO_2$ and $GeO_2$.

10. The SAW device of claim 1, wherein the substrate comprises one of Quartz, Sapphire, Glass, Spinel and SiC.

11. The SAW device of claim 1, wherein the device further comprises an additional layer between the substrate and the TCF compensating layer, wherein the additional layer comprises one of AlN, $Si_3N_4$, diamond and SiC.

12. The SAW device of claim 1, wherein the electrode structure comprises one of a copper-based electrode system of one or more layers, a single layer chosen from W, Mo and Pt, Ta, Ag, Au and Ti.

13. The SAW device of claim 1, wherein the TCF compensating layer is disposed between the substrate and the piezoelectric thin film, wherein the piezoelectric thin film is disposed between the TCF compensating layer and the electrode structure.

* * * * *